(12) United States Patent
Makiyama

(10) Patent No.: US 10,249,749 B2
(45) Date of Patent: Apr. 2, 2019

(54) SEMICONDUCTOR DEVICE AND METHOD FOR MANUFACTURING THE SAME

(71) Applicant: FUJITSU LIMITED, Kawasaki-shi, Kanagawa (JP)

(72) Inventor: Kozo Makiyama, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/997,856

(22) Filed: Jun. 5, 2018

(65) Prior Publication Data

US 2018/0350963 A1 Dec. 6, 2018

(30) Foreign Application Priority Data

Jun. 6, 2017 (JP) ................................ 2017-111930

(51) Int. Cl.
| | |
|---|---|
| H01L 29/778 | (2006.01) |
| H01L 29/80 | (2006.01) |
| H01L 29/66 | (2006.01) |
| H01L 29/20 | (2006.01) |
| H01L 29/08 | (2006.01) |

(52) U.S. Cl.
CPC ...... *H01L 29/7784* (2013.01); *H01L 29/0843* (2013.01); *H01L 29/2003* (2013.01); *H01L 29/66462* (2013.01); *H01L 29/80* (2013.01)

(58) Field of Classification Search
None
See application file for complete search history.

(56) References Cited

U.S. PATENT DOCUMENTS

2018/0350963 A1* 12/2018 Makiyama .......... H01L 29/7784

FOREIGN PATENT DOCUMENTS

| JP | 2005-217364 | 8/2005 |
|---|---|---|
| JP | 2011-060950 | 3/2011 |

* cited by examiner

Primary Examiner — Jack S Chen
(74) Attorney, Agent, or Firm — Fujitsu Patent Center

(57) ABSTRACT

A semiconductor device includes a buffer layer, a channel layer, and a carrier supply layer; first and second recesses formed in the channel layer and the carrier supply layer, to reach the buffer layer; first and second nitride semiconductor layers in the first and second recess, respectively; a source electrode over the first nitride semiconductor layer; a drain electrode over the second nitride semiconductor layer; and a gate electrode over the carrier supply layer between the first and second recesses. Each of the first and second nitride semiconductor layers includes first and second regions containing donors. An interface between the first and second regions is positioned deeper than two-dimensional electron gas on a surface side of the channel layer, and energy at a bottom of a conduction band of the second region is higher than energy at a bottom of a conduction band of the first region.

13 Claims, 19 Drawing Sheets

SEMICONDUCTOR DEVICE AND METHOD FOR MANUFACTURING THE SAME

CROSS-REFERENCE TO RELATED APPLICATIONS

This application is based upon and claims the benefit of priority of the prior Japanese Priority Application No. 2017-111930 filed on Jun. 6, 2017, the entire contents of which are hereby incorporated by reference.

FIELD

The present disclosure relates to a semiconductor device and a method for manufacturing the same.

BACKGROUND

GaN-based, high-mobility-electron transistors (GaN-HEMI) that use GaN in a channel layer, and an In-based nitride semiconductor in an electron supply layer (barrier layer) have been attracting attention. This structure enables to induce a high-concentration two-dimensional electron gas even when formed as a thinner layer, and hence, enables to obtain a superior high-output characteristic and a high-frequency characteristic compared with a structure that uses AlGaN in an electron supply layer.

However, an In-based nitride semiconductor has a problem in that the ohmic contact resistance is high. A high contact resistance reduces a maximum current between the source and the drain, and directly affects the output characteristic of an amplifier. Also, a higher contact resistance is more likely to induce an electric field concentration in the ohmic electrode, which expedites physical and chemical changes, and tends to lower the reliability of the ohmic electrode.

Regarding such reduction of the ohmic contact resistance, a structure has been publicly known in which a regrowth layer is formed to contain donors in an electron supply layer and a channel layer. This structure enables to reduce the ohmic contact resistance by providing the ohmic electrode over the regrowth layer.

However, use of such a regrowth layer containing donors introduces decline of the pinch-off characteristic, namely, increase of the drain leakage current, due to extensive and direct contact between the regrowth layer and donors that remain, for example, in the buffer layer and in a deep part of the channel located deeper than a region where the two-dimensional electron gas exists. As such, in a conventional semiconductor device, it is not possible to guarantee both the reduction of the ohmic contact resistance, and the superior pinch-off characteristic.

RELATED-ART DOCUMENTS

Patent Documents

[Patent Document 1] Japanese Laid-Open Patent Publication No. 2005-217364
[Patent Document 2] Japanese Laid-Open Patent Publication No. 2011-60950

SUMMARY

According to an aspect in the present disclosure, a semiconductor device includes a buffer layer; a channel layer over the buffer layer; a carrier supply layer over the channel layer; a first recess and a second recess that are formed in the channel layer and the carrier supply layer, and that reach the buffer layer; a first nitride semiconductor layer in the first recess; a second nitride semiconductor layer in the second recess; a source electrode over the first nitride semiconductor layer; a drain electrode over the second nitride semiconductor layer; and a gate electrode over the carrier supply layer between the first recess and the second recess. Each of the first nitride semiconductor layer and the second nitride semiconductor layer includes a first region containing donors, and a second region under the first region. An interface between the first region and the second region is positioned deeper than two-dimensional electron gas on a surface side of the channel layer, and energy at a bottom of a conduction band of the second region is higher than energy at a bottom of a conduction band of the first region.

According to an aspect in the present disclosure, a method of manufacturing a semiconductor device includes a process of forming a channel layer over a buffer layer; a process of forming a carrier supply layer over the channel layer; a process of forming a first recess and a second recess that reach the buffer layer, in the channel layer and the carrier supply layer; a process of forming a first nitride semiconductor layer in the first recess, and forming a second nitride semiconductor layer in the second recess; a process of forming a source electrode over the first nitride semiconductor layer, and forming a drain electrode over the second nitride semiconductor layer; a process of forming a gate electrode over the carrier supply layer between the first recess and the second recess. The process of forming the first nitride semiconductor layer and the second nitride semiconductor layer includes a process of forming a second region, and a process of forming a first region containing donors over the second region. An interface between the first region and the second region is positioned deeper than two-dimensional electron gas on a surface side of the channel layer, and energy at a bottom of a conduction band of the second region is higher than energy at a bottom of a conduction band of the first region.

The object and advantages in the embodiment will be realized and attained by means of the elements and combinations particularly pointed out in the claims. It is to be understood that both the foregoing general description and the following detailed description are exemplary and explanatory and are not restrictive of the invention as claimed.

DESCRIPTION OF EMBODIMENTS

In the following, embodiments will be specifically described with reference to the attached drawings.

According to an embodiment, it is possible to provide a semiconductor device in which both the reduction of the ohmic contact resistance, and the superior pinch-off characteristic are realized, and to provide a method for manufacturing the semiconductor device.

A semiconductor device according to an embodiment is formed so that a first nitride semiconductor layer and a second nitride semiconductor layer include a first region and a second region that are suitably formed, such that it is possible to realize a semiconductor device enabling both the reduction of the ohmic contact resistance, and the superior pinch-off characteristic.

First Embodiment

Figure 1:
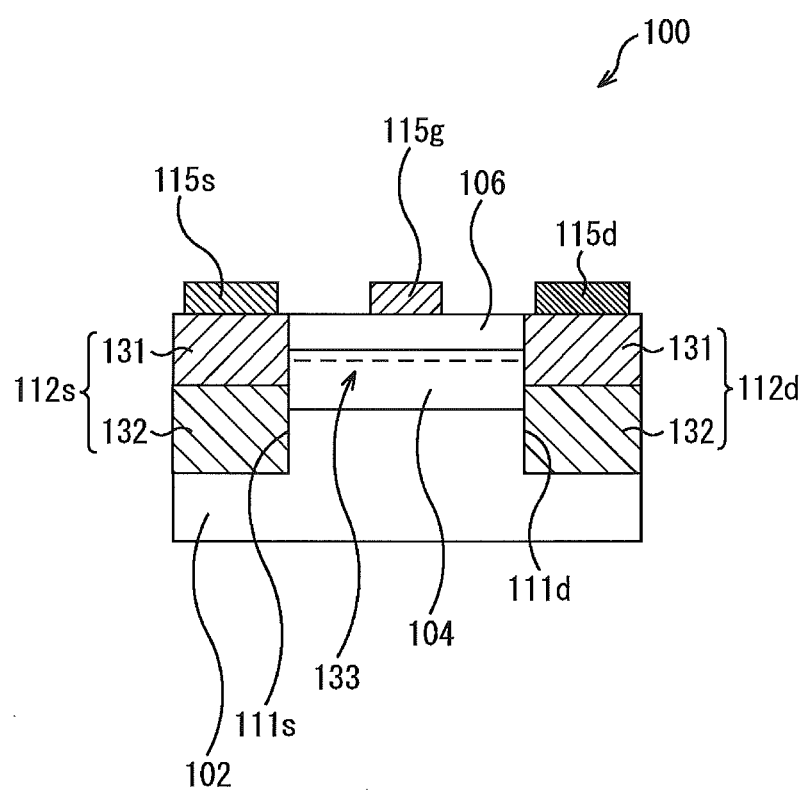
FIG. 1 is a cross-sectional view illustrating a structure of a semiconductor device according to a first embodiment.

First, a first embodiment will be described. The first embodiment relates to an example of a semiconductor device that includes a HEMT. FIG. 1 is a cross-sectional view illustrating a structure of a semiconductor device according to the first embodiment.

As illustrated in FIG. 1, a buffer layer 102, a channel layer 104 over the buffer layer 102, and a carrier supply layer 106 over the channel layer 104 are included in a semiconductor device 100 according to the first embodiment. Recesses 111s and 111d that reach the buffer layer 102 are formed in the carrier supply layer 106 and the channel layer 104; a regrowth layer 112s is formed in the recess 111s; and a regrowth layer 112d is formed in the recess 111d. Between the recesses 111s and 111d, two-dimensional electron gas 133 exists on the surface side of the channel layer 104. A donor-containing region 131 containing donors and a trap shield region 132 under the donor-containing region 131 are included in each of the regrowth layers 112s and 112d. The energy (potential) at the bottom of the conduction band of the trap shield region 132 is higher than the energy (potential) at the bottom of the conduction band of the donor-containing region 131. The interface between the donor-containing region 131 and the trap shield region 132 is positioned deeper than the two-dimensional electron gas 133. A source electrode 115s is formed over the regrowth layer 112s; a drain electrode 115d is formed over the regrowth layer 112d; and a gate electrode 115g is formed over the carrier supply layer 106 between the source electrode 115s and the drain electrode 115d. The recess 111s is an example of a first recess; the recess 111d is an example of a second recess; the regrowth layer 112s is an example of a first nitride semiconductor layer; and the regrowth layer 112d is an example of a second nitride semiconductor layer. The donor-containing region 131 is an example of a first region; and the trap shield region 132 is an example of a second region. Note that a substrate may be included and an intermediate layer 105 may be included between the channel layer 104 and the carrier supply layer 106.

In the semiconductor device 100, since the interface between the donor-containing region 131 and the trap shield region 132 is positioned deeper than the two-dimensional electron gas 133, the ohmic contact resistance is small between the two-dimensional electron gas 133, and the source electrode 115s and the drain electrode 115d. Also, even if traps exist in the vicinity of the bottom of the regrowth layers 112s and 112d, static and transient influences on electrical characteristics due to the traps are sufficiently inhibited. This is because the interface between the donor-containing region 131 and the trap shield region 132 is positioned deeper than the two-dimensional electron gas 133, and the bottom of the regrowth layers 112s and 112d is positioned further deeper.

In the case where donors are contained in the entire regrowth layers 112s and 112d, the pinch-off characteristic is likely to decline under an influence of the donor level. In contrast, in the first embodiment, the trap shield region 132 exists under the donor-containing region 131, and the energy (potential) at the bottom of the conduction band of the trap shield region 132 is higher than the energy (potential) at the bottom of the conduction band of the donor-containing region 131. For example, in the case where the donor-containing region 131 is formed entirely in the regrowth layers 112s and 112d, the donor-containing region 131 extensively and directly contacts the buffer layer 102 and a deep part of the channel layer 104 located deeper than a region where the two-dimensional electron gas 133 exists, which causes an increase of the drain leakage current. In contrast, the trap shield region 132 included in the first embodiment can cut off a current path from one donor-containing region 131 to the other donor-containing region 131 through the buffer layer 102 and the deep part of the channel layer 104, and can inhibit decline of the pinch-off characteristic.

The buffer layer 102 and the channel layer 104 may be formed as a single layer.

Next, a method for manufacturing the semiconductor device 100 according to the first embodiment will be described. FIGS. 2A-2D are cross-sectional views illustrating a method of manufacturing a semiconductor device according to the first embodiment, in order of the processes.

Figure 2A:
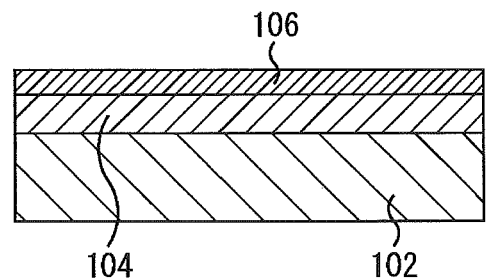
FIGS. 2A-2D are cross-sectional views illustrating a method of manufacturing a semiconductor device according to the first embodiment, in order of the processes.
Figure 2B:
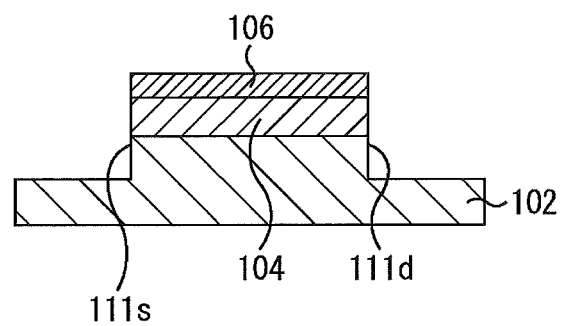
Figure 2C:
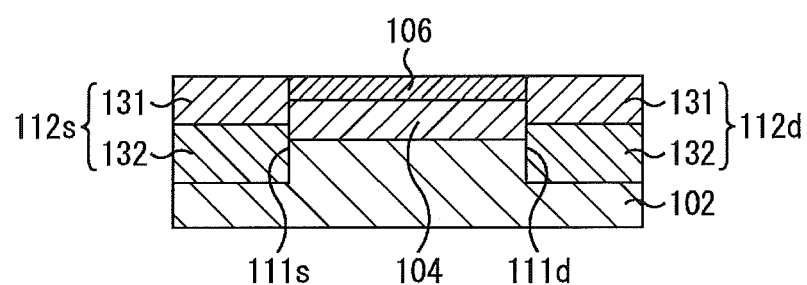
Figure 2D:
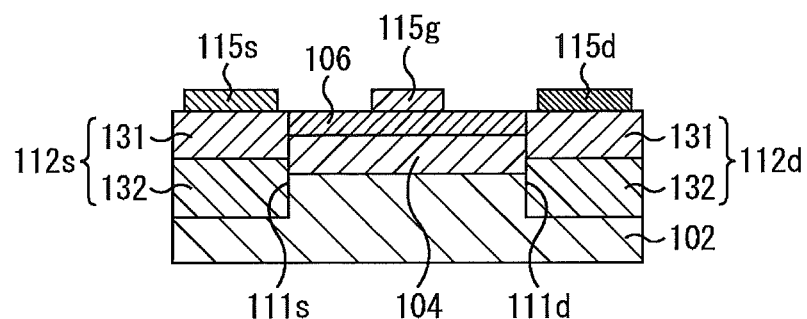

First, as illustrated in FIG. 2A, a carrier supply layer 106 is formed over a channel layer 104. Next, as illustrated in FIG. 2B, recesses 111s and 111d are formed in the channel layer 104 and the carrier supply layer 106. Then, as illustrated in FIG. 2C, a regrowth layer 112s is formed in the recess 111s, and a regrowth layer 112d is formed in the recess 111d. Subsequently, as illustrated in FIG. 2D, a source electrode 115s is formed over the regrowth layer 112s, a drain electrode 115d is formed over the regrowth layer 112d, and a gate electrode 115g is formed over the carrier supply layer 106. Forming of the regrowth layers 112s and 112d is carried out by first growing a trap shield region 132, and then, growing a donor-containing region 131 over the trap shield region 132. When growing the trap shield region 132, traps may be generated between the bottom of the trap shield region 132 and the surface of the buffer layer 102 due to a factor such as carbon pollution. To relax the influence of such traps, the trap shield region 132 having the high energy at the bottom of the conduction band is placed.

In this way, the semiconductor device 100 according to the first embodiment can be manufactured.

Second Embodiment

Figure 3:
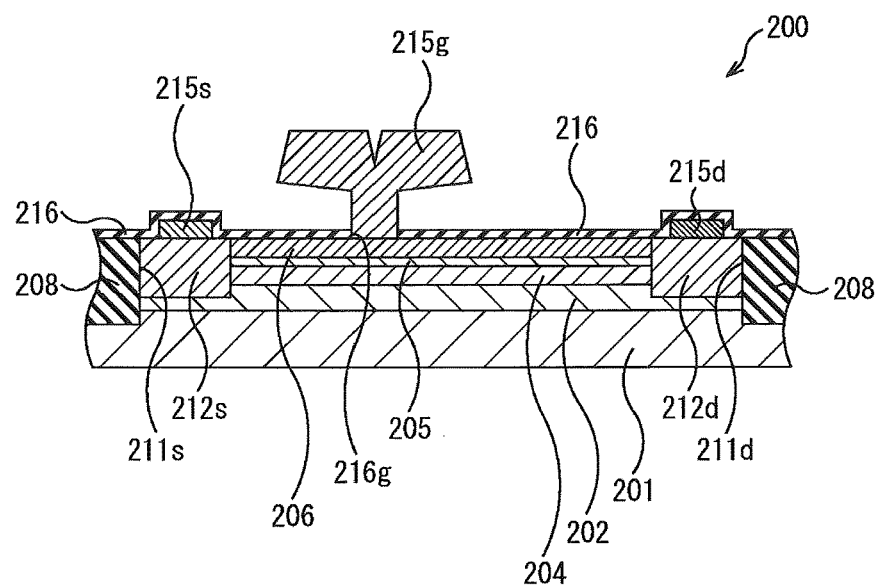
FIG. 3 is a cross-sectional view illustrating a structure of a semiconductor device according to a second embodiment.
Figure 4A:
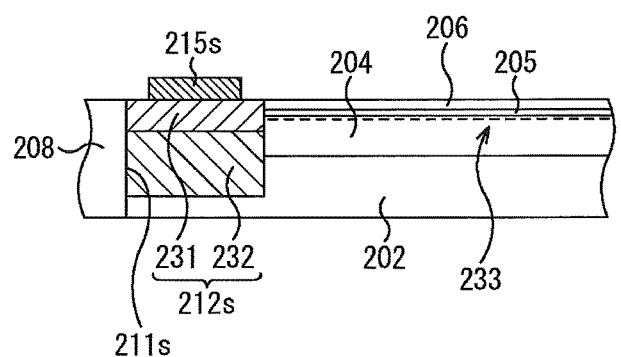
FIGS. 4A-4B are enlarged views of parts of FIG. 3.
Figure 4B:
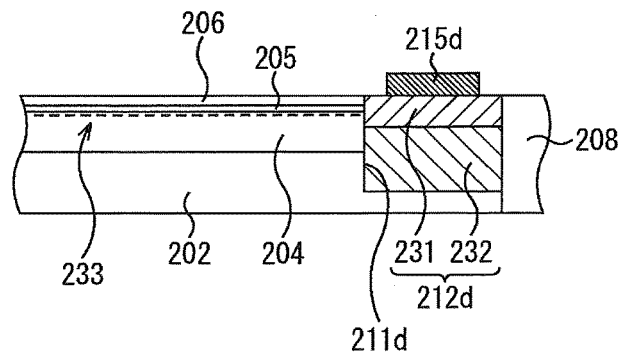

Next, a second embodiment will be described. The second embodiment relates to an example of a semiconductor device that includes a HEMT. FIG. 3 is a cross-sectional view illustrating a structure of a semiconductor device according to the second embodiment; and FIGS. 4A-4B are enlarged views of parts of FIG. 3.

In the semiconductor device 200 according to the second embodiment, as illustrated in FIG. 3, a buffer layer 202, a channel layer 204, an intermediate layer 205, and a carrier supply layer 206 are formed over a substrate 201. The substrate 201 is, for example, a semi-insulating SiC substrate. The buffer layer 202 and the channel layer 204 are, for example, i-type GaN layers (i-GaN layer) in which intentional doping of impurities is not performed. The total thickness of the buffer layer 202 and the channel layer 204 is, for example, around 2.5 μm to 3.5 μm. The buffer layer 202 prevents lattice defects, which exist on the surface of the substrate 201, from propagating to the channel layer 204. The intermediate layer 205 is, for example, an AlN layer having the thickness of 1 nm to 2 nm. The carrier supply layer 206 is, for example, an InAlGaN layer having the thickness of 5 nm to 15 nm.

An element separation region 208 that delimits an active region is formed in the buffer layer 202, the channel layer 204, the intermediate layer 205, and the carrier supply layer 206. In the active region, recesses 211s and 211d reaching the buffer layer 202 are formed in the cap layer 207, the carrier supply layer 206, the intermediate layer 205, and the channel layer 204; a regrowth layer 212s is formed in the recess 211s; and a regrowth layer 212d is formed in the recess 211d. FIG. 4A illustrates the vicinity of the regrowth layer 212s; and FIG. 4B illustrates the vicinity of the regrowth layer 212d. As illustrated in FIG. 4A and 4B, two-dimensional electron gas 233 exists on the surface side of the channel layer 204, between the recesses 211s and 211d. A donor-containing region 231 containing donors and a trap shield region 232 under the donor-containing region 231 are included in the regrowth layers 212s and 212d. The energy (potential) at the bottom of the conduction band of the trap shield region 232 is higher than the energy (potential) at the bottom of the conduction band of the donor-containing region 231. The interface between the donor-containing region 231 and the trap shield region 232 is positioned deeper than the two-dimensional electron gas 233. The depth of the recesses 211s and 211d is, for example, 40 nm to 60 nm. The donor-containing region 231 is, for example, an n-type GaN layer (n-GaN layer) having the thickness of 10 nm to 20 nm, and the trap shield region 232 is, for example, an i-type GaN layer (i-GaN layer) having the thickness of 30 nm to 40 nm in which intentional doping of impurities is not performed. The donor-containing region 231 contains Si by the concentration of, for example, $1 \times 10^{19}$ cm$^{-3}$ or greater. The recess 211s is an example of a first recess; the recess 211d is an example of a second recess; a regrowth layer 212s is an example of the first nitride semiconductor layer; and a regrowth layer 212d is an example of the second nitride semiconductor layer. The donor-containing region 231 is an example of a first region, and the trap shield region 232 is an example of a second region.

A source electrode 215s is formed over the regrowth layer 212s, and a drain electrode 215d is formed over the regrowth layer 212d. A passivation film 216 is formed to cover the carrier supply layer 206, the source electrode 215s, and the drain electrode 215d. An opening 216g is formed between the source electrode 215s and the drain electrode 215d in the passivation film 216. A gate electrode 215g that contacts the carrier supply layer 206 through the opening 216g is provided. Each of the source electrode 215s and the drain electrode 215d includes, for example, a Ti layer having the thickness of 10 nm to 30 nm, and an Au layer having the thickness of 180 nm to 220 nm over the Ti layer. The gate electrode 215g includes, for example, a Ni layer having the thickness of 5 nm to 15 nm, and an Au layer having the thickness of 280 nm to 320 nm over the Ni layer. The passivation film 216 is, for example, a silicon nitride film having the thickness of 40 nm to 60 nm. The refractive index of the silicon nitride film at 633 nm is, for example, in the vicinity of 2.0 stoichiometry.

In the semiconductor device 200, since the interface between the donor-containing region 231 and the trap shield region 232 is positioned deeper than the two-dimensional electron gas 233, the ohmic contact resistance is small between the two-dimensional electron gas 233, and the source electrode 215s and the drain electrode 215d. Also, even if traps exist in the vicinity of the bottom of the regrowth layers 212s and 212d, static and transient influences on the electrical characteristics due to the traps are sufficiently inhibited. This is because the interface between the donor-containing region 231 and the trap shield region 232 is positioned deeper than the two-dimensional electron gas 233, and the bottom of the regrowth layers 212s and 212d is positioned further deeper.

In the case where donors are contained in the entire regrowth layers 212s and 212d, the pinch-off characteristic is likely to decline due to an influence of the donor level. In contrast, in the second embodiment, the trap shield region 232 exists under the donor-containing region 231, and the energy (potential) at the bottom of the conduction band of the trap shield region 232 is higher than the energy (potential) at the bottom of the conduction band of the donor-containing region 231. For example, in the case where the donor-containing region 231 is formed entirely in the regrowth layers 212s and 212d, the donor-containing region 231 extensively and directly contacts the buffer layer 202 and a deep part of the channel layer 204 located deeper than a region where the two-dimensional electron gas 233 exists, which causes an increase of the drain leakage current. In contrast, the trap shield region 232 included in the second embodiment can cut off a current path from one donor-containing regions 231 to the other donor-containing region 231 through the buffer layer 202 and the deep part of the channel layer 204, and can inhibit decline of the pinch-off characteristic.

Figure 5A:
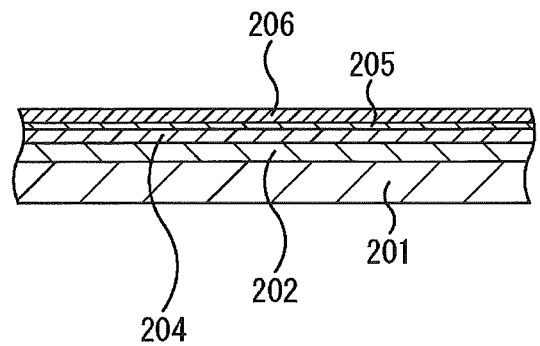
FIGS. 5A-5O are cross-sectional views illustrating a method of manufacturing a semiconductor device according to the second embodiment, in order of the processes.

Next, a method for manufacturing a semiconductor device 200 according to the second embodiment will be described. FIGS. 5A-5O are cross-sectional views illustrating a method of manufacturing a semiconductor device according to the second embodiment, in order of the processes.

First, as illustrated in FIG. 5A, a buffer layer 202, a channel layer 204, an intermediate layer 205, and a carrier supply layer 206 are formed over a substrate 201. The buffer layer 202, the channel layer 204, the intermediate layer 205, and the carrier supply layer 206 can be formed, for example, by a crystal growth method such as metal organic vapor phase epitaxy (MOVPE).

Figure 5B:
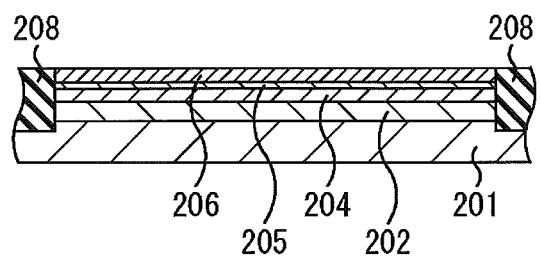

Next, as illustrated in FIG. 5B, an element separation region 208 that delimits an active region is formed in the carrier supply layer 206, the intermediate layer 205, the channel layer 204, the buffer layer 202, and a surface part of the substrate 201. The element separation region 208 can be formed, for example, by injecting Ar.

Figure 5C:
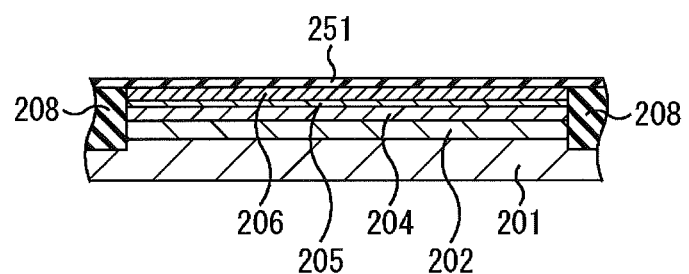

Then, as illustrated in FIG. 5C, a silicon nitride film 251 is formed over the carrier supply layer 206 and the element separation region 208. The silicon nitride film 251 can be formed, for example, by plasma chemical vapor deposition (CVD) using $SiH_4$ and $NH_3$ as the materials. The thickness of the silicon nitride film 251 is, for example, 40 nm to 60 nm.

Figure 5D:
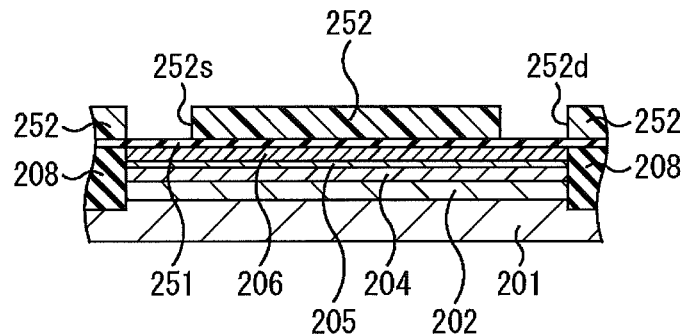

Subsequently, as illustrated in FIG. 5D, a resist pattern 252 that has an opening 252s formed at a region where recess 211s is to be formed, and an opening 252d formed at a region where recess 211d is to be formed, is formed over the silicon nitride film 251.

Figure 5E:
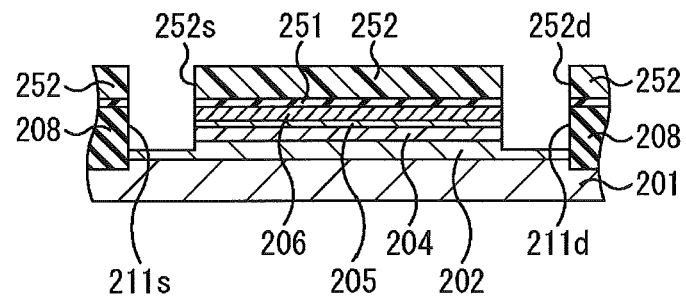

Next, as illustrated in FIG. 5E, dry etching is applied to the silicon nitride film 251, by using the resist pattern 252 as the mask. In this dry etching, for example, $SF_6$ gas is used. The dry etching is further applied to the carrier supply layer 206, the intermediate layer 205, the channel layer 204, and the buffer layer 202, by using the resist pattern 252 as the mask. Consequently, the recesses 211s and 211d are formed. In this dry etching, an inactive gas and a chloric-based gas such as $Cl_2$ gas are used.

Figure 5F:
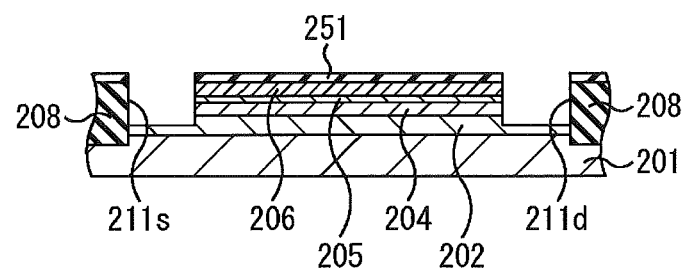

Then, as illustrated in FIG. 5F, the resist pattern 252 is removed. The resist pattern 252 can be removed, for example, by using a warmed organic solvent.

Figure 5G:
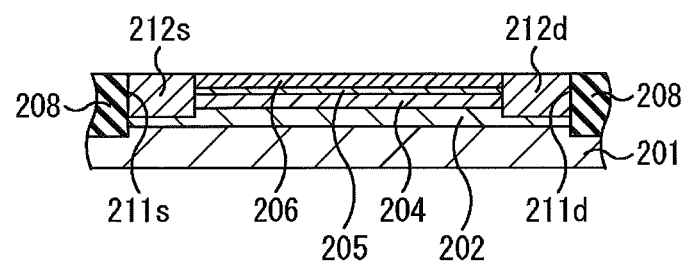
Figure 6A:
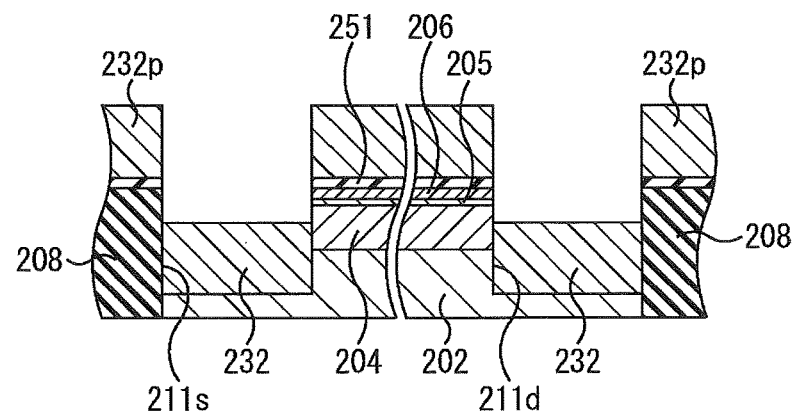
FIGS. 6A-6C are cross-sectional views illustrating a method of forming a regrowth layer in order of the processes.
Figure 6B:
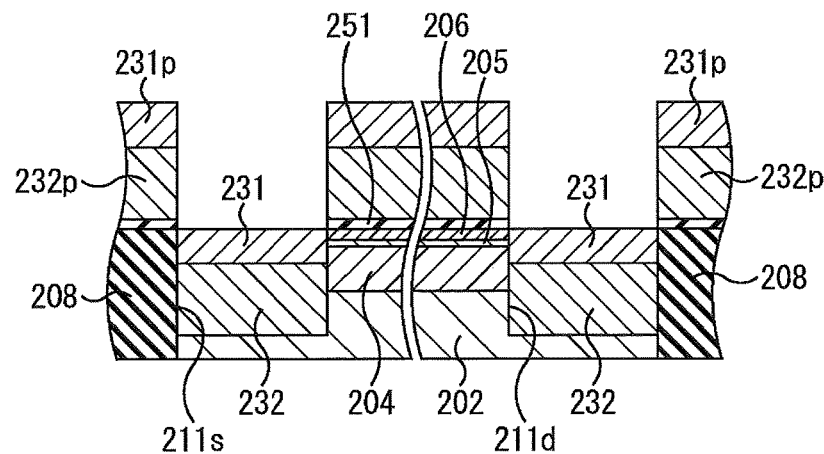
Figure 6C:
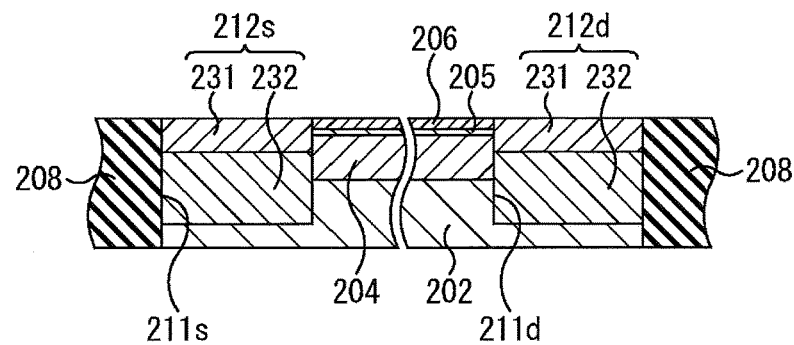

Subsequently, as illustrated in FIG. 5G, a regrowth layer 212s is formed in the recess 211s, and a regrowth layer 212d is formed in the recess 211d. Here, a method of forming regrowth layers 212s and 212d will be described. FIGS. 6A-6C are cross-sectional views illustrating a method of forming regrowth layers 212s and 212d in order of the processes. First, as illustrated in FIG. 6A, a trap shield region 232 is formed at the bottom of each of the recesses 211s and 211d, and then, as illustrated in FIG. 6B, a donor-containing region 231 is formed over the trap shield region 232. The trap shield region 232 and the donor-containing region 231 can be formed, for example, by a crystal growth method such as molecular beam epitaxy (MBE). When growing the trap shield region 232, traps may be generated between the bottom of the trap shield region 232, and the surface of the buffer layer 202 due to a factor such as carbon contamination. The donor-containing region 231 is doped, for example, by Si by the concentration of $1 \times 10^{19}$ $cm^{-3}$ or greater. As illustrated in FIGS. 6A and 6B, over the silicon nitride film 251, a polycrystalline GaN layer 232p is formed simultaneously with the trap shield region 232, and a polycrystalline GaN layer 231p is formed simultaneously with the donor-containing region 231. After the donor-containing region 231 has been formed, as illustrated in FIG. 6C, the polycrystalline GaN layers 231p and 232p are removed. The polycrystalline GaN layers 231p and 232p can be removed, for example, by using a hydrofluoric acid solution. Furthermore, the silicon nitride film 251 is removed. In this way, the regrowth layers 212s and 212d can be formed.

Figure 5H:
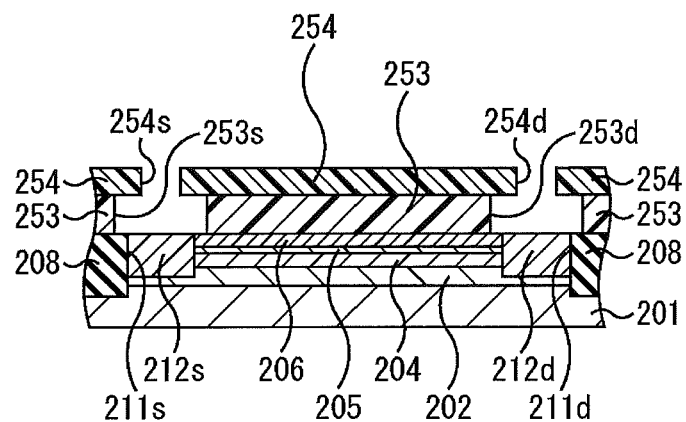

After the regrowth layers 212s and 212d have been formed, as illustrated in FIG. 5H, a resist pattern 253 and a resist pattern 254 are formed over the carrier supply layer 206 and the element separation region 208. The resist pattern 253 has an opening 253s in a region where a source electrode is to be formed, and an opening 253d in a region where a drain electrode is to be formed. The resist pattern 254 has an opening 254s in a region where the source electrode is to be formed, and an opening 254d in a region where the drain electrode is to be formed. Forming of the resist pattern 253 and the resist pattern 254 is carried out by first forming two resist layers, and then, forming the opening 254s and the opening 254d over the upper resist layer, to obtain the resist pattern 254. Next, by using the resist pattern 254 as the mask, the opening 253s and the opening 253d are formed in the lower resist layer, to obtain the resist pattern 253 having a setback structure. As the material of the resist pattern 253, for example, polymethylglutarimide (PMGI) (e.g., a product manufactured by MicroChem Corp. in the US) may be used, and as a material of the resist pattern 254, ZEP520 manufactured by Nippon Zeon Co., Ltd. may be used. These resists can be applied by a spin coat method, and after the application of the layers, prebaking is executed for 5 minutes at 180° C. in an $N_2$ gas atmosphere. In an exposure process of forming the openings 254s and 254d, electron beam lithography is executed, and as a developing solution, for example, a mixed developing solution of methyl ethyl ketone (MEK) and meso isobutyl ketone (MIBK) is used. When forming the openings 253s and 253d, for example, NMD-W manufactured by TOKYO OHKA KOGYO CO., LTD. is used as a developing solution. In this way, the resist pattern having an eaves-like structure is obtained.

Figure 5I:
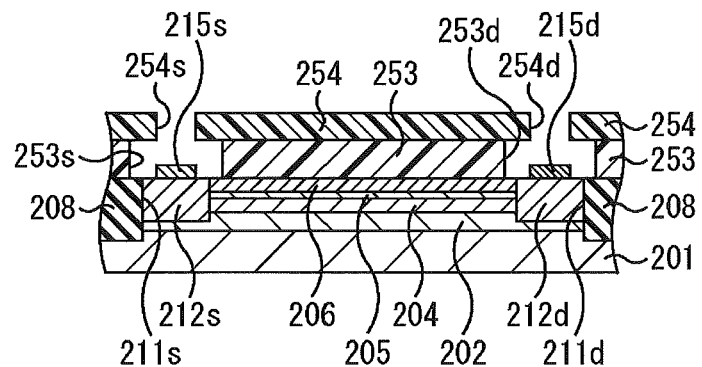

Next, as illustrated in FIG. 5I, a source electrode 215s is formed over the regrowth layer 212s, and a drain electrode 215d is formed over the regrowth layer 212d. Forming of the source electrode 215s and the drain electrode 215d is carried out, for example, by forming a Ti layer by an evaporation method, and forming an Al layer over the Ti layer by an evaporation method. The resist patterns 253 and 254 are removed together with the Ti layer and the Al layer above. In other words, forming of the source electrode 215s and the drain electrode 215d uses, for example, technologies of vapor deposition and lift-off. The resist patterns 253 and 254 can be removed, for example, by using a warmed organic solvent. Then, a heat treatment is applied at around 550° C., to establish the ohmic contact between the source electrode 215s and the regrowth layer 212s, and to establish the ohmic contact between the drain electrode 215d and the regrowth layer 212d.

Figure 5J:
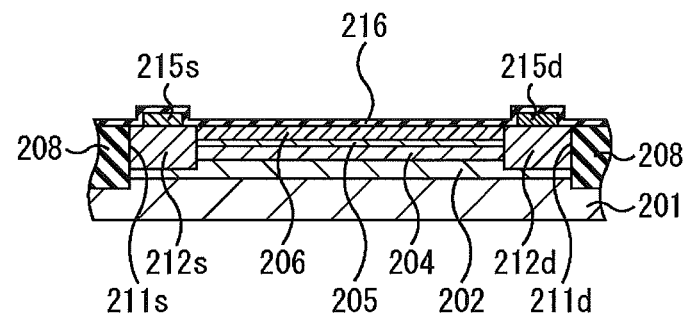

Subsequently, as illustrated in FIG. 5J, a passivation film 216 is formed to cover the carrier supply layer 206, the source electrode 215s, the drain electrode 215d, the regrowth layer 212s, the regrowth layer 212d, and the element separation region 208. The passivation film 216 can be formed by a plasma CVD method that uses, for example, $SiH_4$ and $NH_3$ as the materials.

Figure 5K:
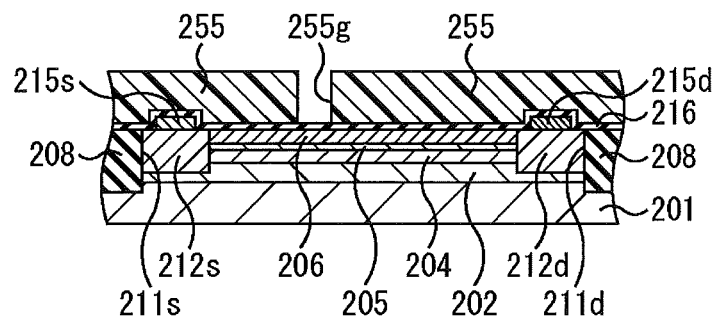

Subsequently, as illustrated in FIG. 5K, a resist pattern 255 that includes an opening 255g in a region where an opening 216g is to be formed, is formed over the passivation film 216. As the material of the resist pattern 255, for example, polymethylglutarimide (PMGI) (e.g., a product manufactured by MicroChem Corp. in the US) may be used. In an exposure process of forming the openings 255g, electron beam lithography is executed, and as a developing solution, for example, a mixed developing solution of MIBK and isopropyl alcohol (IPA) (e.g., a product manufactured by Nippon Zeon Co., Ltd.). The dimension of the opening 255g in the direction connecting the source electrode 215s with the drain electrode 215d is set to 0.08 µm to 0.12 µm.

Figure 5L:
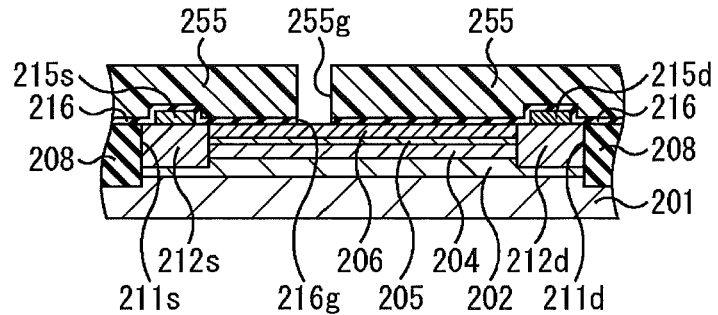

Then, as illustrated in FIG. 5L, an opening 216g is formed in the passivation film 216 by applying dry etching that uses the resist pattern 255 as the mask. In this dry etching, for example, $SF_6$ gas is used.

Figure 5M:
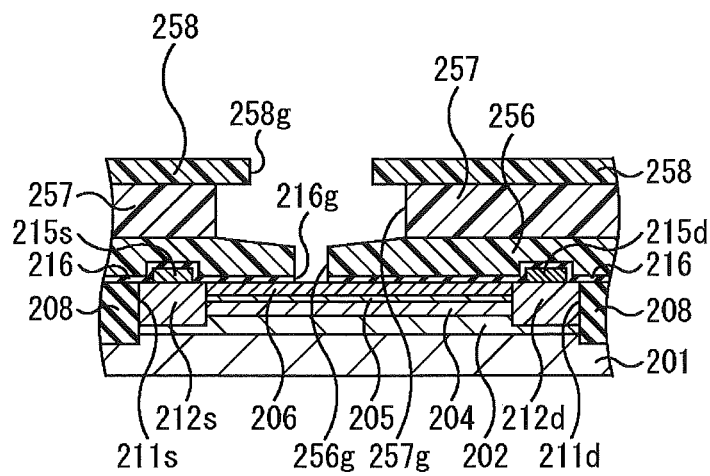

Subsequently, as illustrated in FIG. 5M, the resist pattern 255 is removed, and a resist pattern 256, a resist pattern 257, and a resist pattern 258 are formed over the passivation film 216. The resist pattern 256 has an opening 256g in a region where a gate electrode 215g is to be formed. The resist pattern 257 has an opening 257g in a region where the gate electrode 215g is to be formed. The resist pattern 258 has an opening 258g in a region where the gate electrode 215g is to be formed. Forming of the resist pattern 256, the resist pattern 257, and the resist pattern 258 is carried out by first forming three resist layers, and then, the opening 258g is formed in the topmost resist layer, to obtain the resist pattern 258. Next, by using the resist pattern 258 as the mask, the opening 257g is formed in the middle resist layer, to obtain the resist pattern 257 having a setback structure. As such the resist pattern for lift-off is formed. Then, the opening 256g is formed in the lowest resist layer, to obtain the resist pattern 256. As the material of the resist pattern 256, for example, PMMA (e.g., a product manufactured by Micro-Chem Corp. in the US) may be used. As the material of the resist pattern 257, for example, PMGI (e.g., a product manufactured by MicroChem Corp. in the US) may be used. As the material of the resist pattern 258, for example, ZEP520 manufactured by Nippon Zeon Co., Ltd. may be used. For example, the thickness of the resist pattern 256 is set to 280 nm to 320 nm, the thickness of the resist pattern 257 is set to 450 nm to 550 nm, and the thickness of the resist pattern 258 is set to 280 nm to 320 nm. These electron beam resists can be applied by a spin coat method, and after the application of the layers, prebaking is executed for 5 minutes at 180° C. in an $N_2$ gas atmosphere. In an exposure process of forming the opening 258a, electron beam lithography is executed, and as a developing solution, for example, ZEP-SD manufactured by Nippon Zeon Co., Ltd. is used. The dimension of the opening 258a in the direction connecting the source electrode 215s with the drain electrode 215d is set to, for example, 0.7 µm to 0.9 µm. When forming the opening 257a, for example, NMD-W manufactured by TOKYO OHKA KOGYO CO., LTD. is used as a developing solution. In the direction connecting the source electrode 215s with the drain electrode 215d, the opening 257g is set back with respect to the opening 258g by approximately 0.5 µm on both sides toward the source electrode 215s and the drain electrode 215d, respectively. In this way, the resist pattern having an eaves-like structure is obtained. In an exposure process of forming the opening 256a, electron beam lithography is executed, and as a developing solution, for example, ZMD-B manufactured by Nippon Zeon Co., Ltd. is used. The dimension of the opening 256g in the direction connecting the source electrode 215s with the drain electrode 215d is set to, for example, 0.08 µm to 0.12 µm.

Figure 5N:
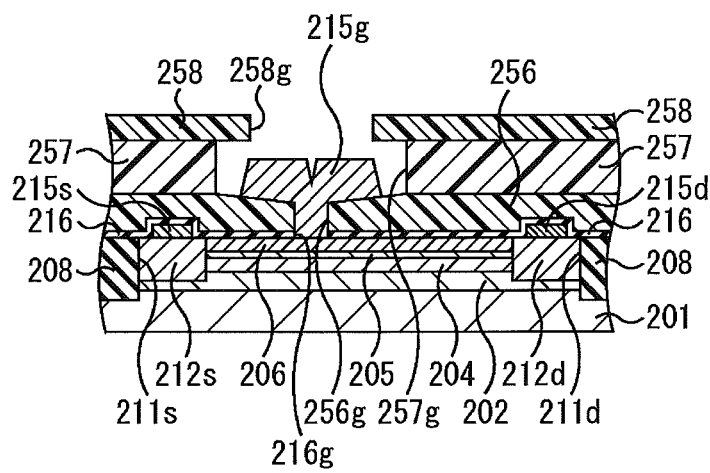
Figure 5O:
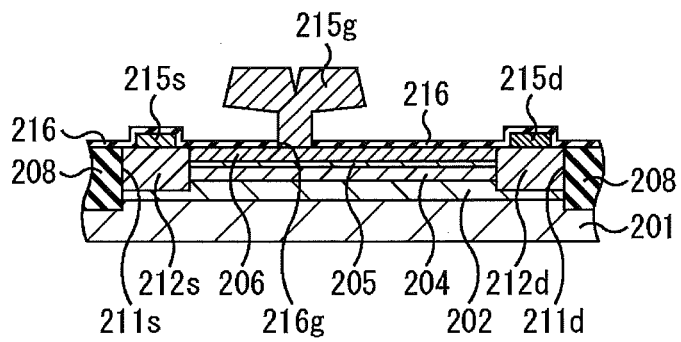

Next, as illustrated in FIG. 5N, the gate electrode 215g that contacts the carrier supply layer 206 is formed in the openings 256g and 257g. Forming of the gate electrode 215g is carried out, for example, by forming an Ni layer by an evaporation method, and forming an Au layer over the Ni layer by an evaporation method.

Then, as illustrated in FIG. 5O, the resist patterns 256, 257, and 258 are removed together with the Ni layer and the Au layer above. In other words, forming of the source electrode 215g uses, for example, technologies of vapor deposition and lift-off. The resist patterns 256, 257, and 258 can be removed, for example, by using a warmed organic solvent.

In this way, the semiconductor device 200 according to the second embodiment can be manufactured.

Third Embodiment

Figure 7:
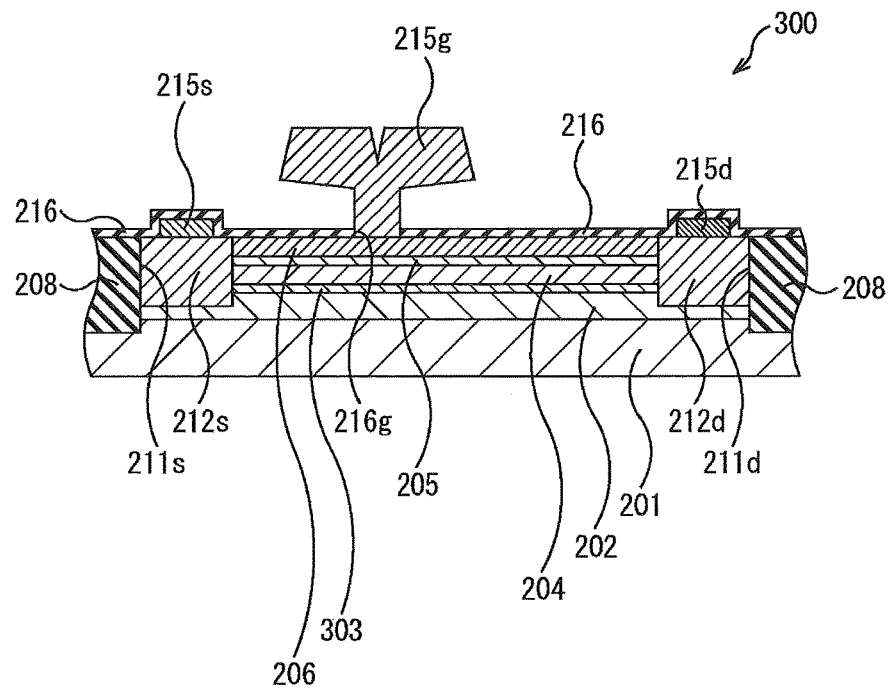
FIG. 7 is a cross-sectional view illustrating a structure of a semiconductor device according to a third embodiment.

Next, a third embodiment will be described. The third embodiment is different from the second embodiment in the structure of stacked layers of compound semiconductors. FIG. 7 is a cross-sectional view illustrating a structure of a semiconductor device according to the third embodiment; and FIGS. 8A-8B are enlarged views of parts of FIG. 7.

Figure 8A:
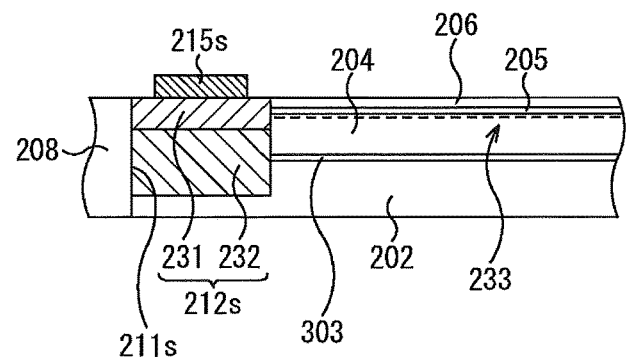
FIGS. 8A-8B are enlarged views of parts of FIG. 7.
Figure 8B:
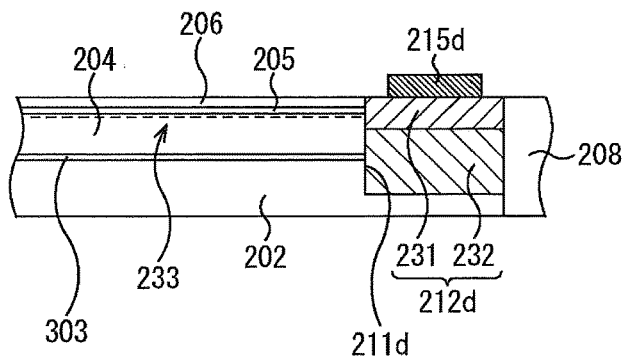

In the semiconductor device 300 according to the third embodiment, as illustrated in FIG. 7 and FIGS. 8A-8B, a back barrier layer 303 is formed between a buffer layer 202 and a channel layer 204. The back barrier layer 303 is, for example, an InGaN layer having the thickness of 1 nm to 5 nm. The back barrier layer 303 is formed at a position deeper than the lower surface of a donor-containing region 231, to contact a trap shield region 232. FIG. 8A illustrates the vicinity of a regrowth layer 212s; and FIG. 8B illustrates the vicinity of a regrowth layer 212d. The other elements are the same as in the second embodiment.

The same effects as in the second embodiment can be obtained in the third embodiment. Also, since the back barrier layer 303 has a barrier effect by reverse piezoelectric charge, a superior pinch-off characteristic can be obtained. Note that regarding the potential of the conduction band, a quantum well is formed in the back barrier layer 303, and electrons tend to accumulate. Therefore, if the back barrier layer 303 contacts the donor-containing region 231, electrons can move between the back barrier layer 303 and the donor-containing regions 231, and thereby, the pinch-off characteristic tends to decline and the leakage current tends to increase. In the semiconductor device 300, since the back barrier layer 303 is formed at a position deeper than the lower surface of the donor-containing region 231, and contacts the trap shield region 232, the movement path of electrons between the back barrier layer 303 and the donor-containing region 231 is cut off by the trap shield region 232. Therefore, decline of the pinch-off characteristic and increase in the leakage current described above are inhibited, and hence, further higher output power and efficiency can be realized.

Figure 9:
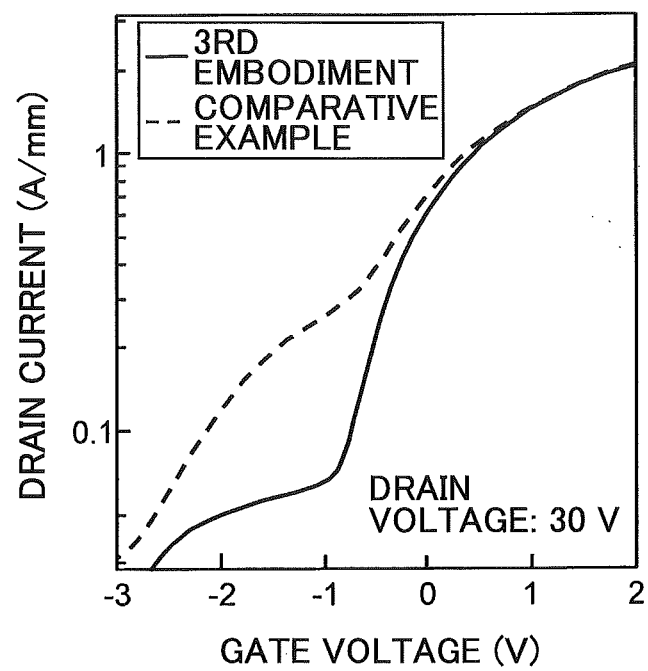
FIG. 9 is a diagram illustrating respective on-resistance characteristics and pinch-off characteristics of the third embodiment and a comparative example.

The on-resistance characteristic and the pinch-off characteristic of the third embodiment and a comparative example are illustrated in FIG. 9. The voltage Vds between the drain and the source is 30 V. In the comparative example, the entire regrowth layer is constituted with a donor-containing region. As illustrated in FIG. 9, compared with the comparative example, the on-resistance is lower and the pinch-off characteristic is superior in the third embodiment. Therefore, the third embodiment is suitable for obtaining a higher output power and a higher efficiency.

In a method for manufacturing the semiconductor device 300 according to the third embodiment, a back barrier layer 303 is formed, for example, between a process of forming a buffer layer 202, and a process of forming a channel layer 204. The back barrier layer 303 can be formed by a crystal growth method such as MOVPE. The other processes are the same as in the method for manufacturing the semiconductor device 200 according to the second embodiment.

Fourth Embodiment

Figure 10A:
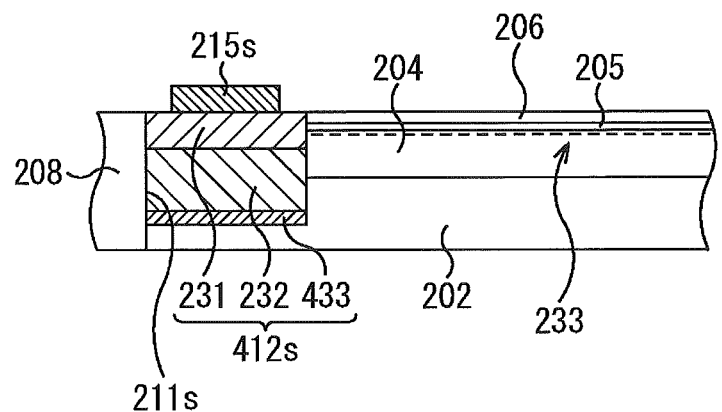
FIGS. 10A-10B are cross-sectional views illustrating the vicinity of a regrowth layer of a semiconductor device according to a fourth embodiment.
Figure 10B:
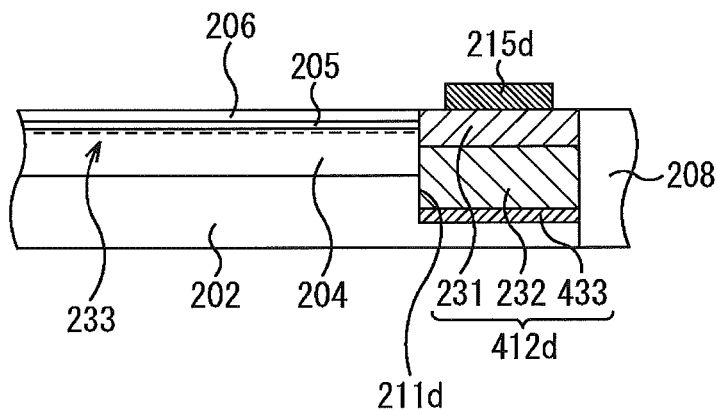

Next, a fourth embodiment will be described. The fourth embodiment is different from the second embodiment in the structure of the regrowth layer. FIGS. 10A-10B are cross-sectional views illustrating the vicinity of a regrowth layer of a semiconductor device according to the fourth embodiment.

In a semiconductor device according to the fourth embodiment, as illustrated in FIGS. 10A-10B, a regrowth layer 412s is included instead of a regrowth layer 212s, and a regrowth layer 412d is included instead of a regrowth layer 212d. FIG. 10A illustrates the vicinity of the regrowth layer 412s; and FIG. 10B illustrates the vicinity of the regrowth layer 412d. In each of the regrowth layers 412s and 412d, other than a donor-containing region 231 and a trap shield region 232, a donor-containing region 433 is included under the trap shield region 232. The donor-containing region 231 is, for example, an n-GaN layer having the thickness of 2 nm to 8 nm; the trap shield region 232 is, for example, an i-GaN layer having the thickness of 27 nm to 33 nm; and the donor-containing region 433 is, for example, an n-GaN layer having the thickness of 10 nm to 20 nm. The donor-containing region 231 and the donor-containing region 433 contain Si by the concentration of, for example, $1 \times 10^{19}$ cm$^{-3}$ or greater. The energy (potential) at the bottom of the conduction band of the trap shield region 232 is higher than the energy (potential) at the bottom of the conduction band of the donor-containing region 433. The regrowth layer 412s is an example of a first nitride semiconductor layer; the regrowth layer 412d is an example of a second nitride semiconductor layer; and the donor-containing region 433 is an example of a third region. The other elements are the same as in the second embodiment.

The same effects as in the second embodiment can be obtained in the fourth embodiment. Also, since the donor-containing region 433 under the trap shield region 232 compensates for traps, it is possible to further relax static and transient responses due to traps.

In a method of manufacturing a semiconductor device according to the fourth embodiment, a donor-containing region 433 is formed, for example, between a process of forming recesses 211s and 211d, and a process of forming a trap shield region 232. The donor-containing region 433 can be formed by a crystal growth method such as MBE. The other processes are the same as in the method for manufacturing the semiconductor device 200 according to the second embodiment.

Fifth Embodiment

Figure 11A:
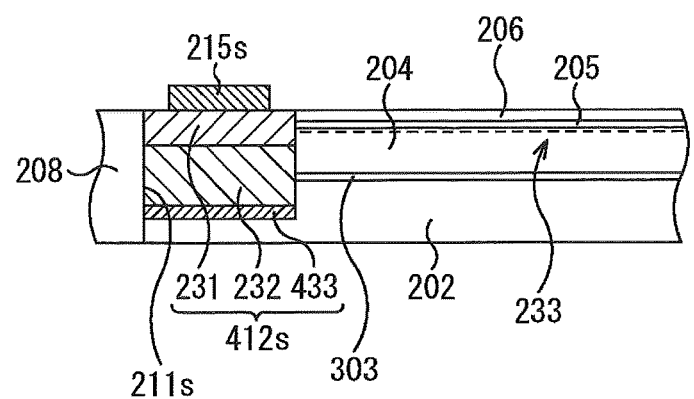
FIGS. 11A-11B are cross-sectional views illustrating the vicinity of a regrowth layer of a semiconductor device according to a fifth embodiment.
Figure 11B:
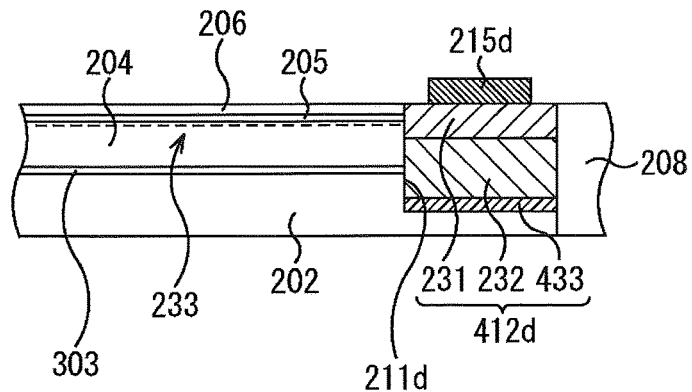

Next, a fifth embodiment will be described. The fifth embodiment is different from the third embodiment in the structure of the regrowth layer. FIGS. 11A-11B are cross-sectional views illustrating the vicinity of a regrowth layer of a semiconductor device according to the fifth embodiment.

In a semiconductor device according to the fifth embodiment, as illustrated in FIGS. 11A-11B, a regrowth layer 412s is included instead of a regrowth layer 212s, and a regrowth layer 412d is included instead of a regrowth layer 212d. FIG. 11A illustrates the vicinity of the regrowth layer 412s; and FIG. 11B illustrates the vicinity of the regrowth layer 412d. In each of the regrowth layers 412s and 412d, other than a donor-containing region 231 and a trap shield region 232, a donor-containing region 433 is included under the trap shield region 232. The interface between the trap shield region 232 and the donor-containing region 433 is positioned deeper than the lower surface of the back barrier layer 303. The other elements are the same as in the third embodiment.

The same effects as in the third embodiment can be obtained in the fifth embodiment. Also, since the donor-containing region 433 under the trap shield region 232 compensates for traps, it is possible to further relax static and transient responses due to traps.

In a method of manufacturing a semiconductor device according to the fifth embodiment, a donor-containing region 433 is formed, for example, between a process of forming recesses 211s and 211d, and a process of forming a trap shield region 232. The donor-containing region 433 can be formed by a crystal growth method such as MBE. The other processes are the same as in the method for manufacturing the semiconductor device 300 according to the third embodiment.

Sixth Embodiment

Figure 12A:
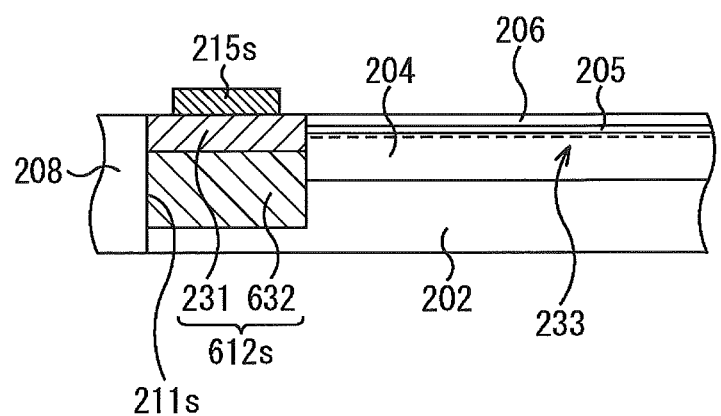
FIGS. 12A-12B are cross-sectional views illustrating the vicinity of a regrowth layer of a semiconductor device according to a sixth embodiment.
Figure 12B:
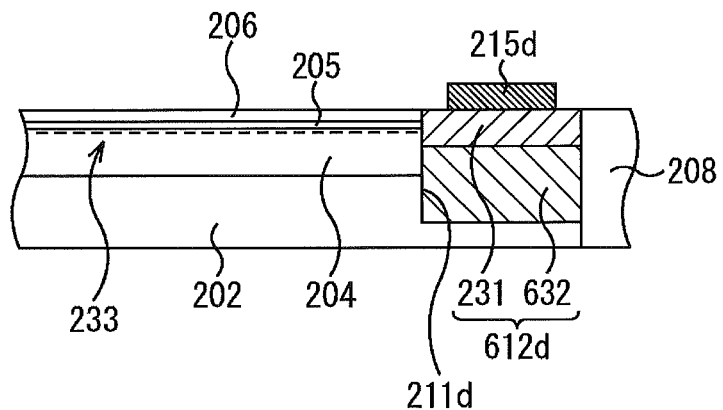

Next, a sixth embodiment will be described. The sixth embodiment is different from the second embodiment in the structure of the regrowth layer. FIGS. 12A-12B are cross-sectional views illustrating the vicinity of a regrowth layer of a semiconductor device according to the sixth embodiment.

In a semiconductor device according to the sixth embodiment, as illustrated in FIGS. 12A-12B, a regrowth layer 612s is included instead of a regrowth layer 212s, and a regrowth layer 612d is included instead of a regrowth layer 212d. FIG. 12A illustrates the vicinity of the regrowth layer 612s; and FIG. 12B illustrates the vicinity of the regrowth layer 612d. In each of the regrowth layers 612s and 612d, a donor-containing region 231 and a trap shield region 632 under the donor-containing region 231 are included. The interface between the donor-containing region 231 and the trap shield region 632 is positioned deeper than the two-dimensional electron gas 233. The donor-containing region 231 is, for example, an n-type GaN layer (n-GaN layer) having the thickness of 10 nm to 20 nm, and the trap shield region 632 is, for example, an AlGaN layer having the thickness of 30 nm to 40 nm. The donor-containing region 231 contains Si by the concentration of, for example, $1 \times 10^{19}$ cm$^{-3}$ or greater. The energy (potential) at the bottom of the conduction band of the trap shield region 632 is higher than the energy (potential) at the bottom of the conduction band of the donor-containing region 231. Also, the band gap of the trap shield region 632 is greater than the band gap of the buffer layer 202. The regrowth layer 612s is an example of a first nitride semiconductor layer, and the regrowth layer 612d is an example of a second nitride semiconductor layer. The trap shield region 632 is an example of a second region. The other elements are the same as in the second embodiment.

Since the interface between the donor-containing region 231 and the trap shield region 632 is positioned deeper than the two-dimensional electron gas 233 in the semiconductor device, the ohmic contact resistance is small between the two-dimensional electron gas 233, and the source electrode 215s and the drain electrode 215d. Also, even if traps exist in the vicinity of the bottom of the regrowth layers 612s and 612d, static and transient influences on the electrical characteristics due to the traps are sufficiently inhibited. This is because the band gap of the trap shield region 632 is greater than the band gap of the buffer layer 202, two-dimensional electron gas exists in the vicinity of the bottom of the regrowth layers 612s and 612d, and this two-dimensional electron gas compensates for the traps. The arrangement in which the interface between the donor-containing region 231 and the trap shield region 632 is positioned deeper than the two-dimensional electron gas 233, and the bottom of the regrowth layers 612s and 612d is positioned further deeper, also contribute to inhibiting static and transient influences of the electrical characteristic due to the traps.

In the case where donors are contained in the entire regrowth layers 612s and 612d, the pinch-off characteristic is likely to decline due to an influence of the donor level (conductivity). In contrast, in the sixth embodiment, the trap shield region 632 exists under the donor-containing region 231, and the energy (potential) at the bottom of the conduction band of the trap shield region 632 is higher than the energy (potential) at the bottom of the conduction band of the donor-containing region 231. For example, in the case where the donor-containing region 231 is formed entirely in the regrowth layers 612s and 612d, the donor-containing region 231 extensively and directly contacts the buffer layer 202 and a deep part of the channel layer 204 located deeper than a region where the two-dimensional electron gas 233 exists, which causes an increase of the drain leakage current. In contrast, the trap shield region 632 included in the sixth embodiment can cut off a current path from one donor-containing region 231 to the other donor-containing region 231 through the buffer layer 202 and the deep part of the channel layer 204, and can inhibit decline of the pinch-off characteristic.

In a method of manufacturing a semiconductor device according to the sixth embodiment, for example, a trap shield region 632 is formed instead of the trap shield region 232. The trap shield region 632 can be formed by a crystal growth method such as MBE. The other processes are the same as in the method for manufacturing the semiconductor device 200 according to the second embodiment.

Seventh Embodiment

Figure 13A:
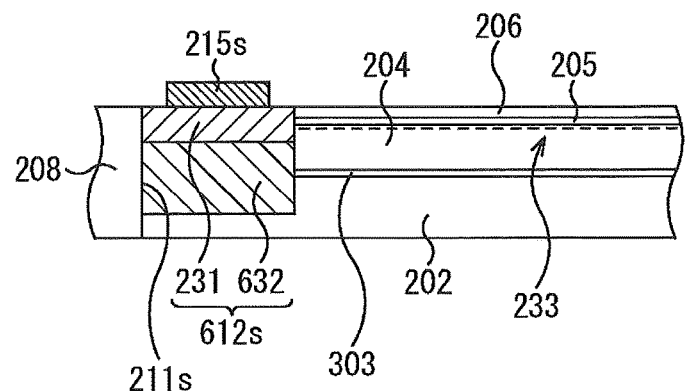
FIGS. 13A-13B are cross-sectional views illustrating the vicinity of a regrowth layer of a semiconductor device according to a seventh embodiment.
Figure 13B:
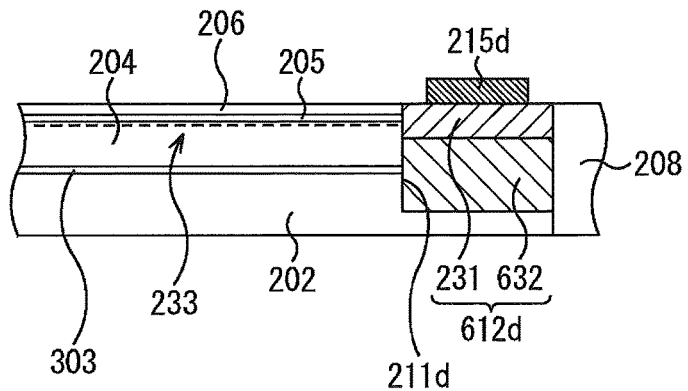

Next, a seventh embodiment will be described. The seventh embodiment is different from the sixth embodiment in the structure of stacked layers of compound semiconductors. FIGS. 13A-13B are cross-sectional views illustrating the vicinity of a regrowth layer of a semiconductor device according to a seventh embodiment.

In a semiconductor device according to the seventh embodiment, as illustrated in FIGS. 13A-13B, a back barrier layer 303 is formed between a buffer layer 202 and a channel layer 204. The back barrier layer 303 is, for example, an InGaN layer having the thickness of 1 nm to 5 nm. The back barrier layer 303 is formed at a position deeper than the lower surface of a donor-containing region 231, and contacts a trap shield region 632. FIG. 13A illustrates the vicinity of a regrowth layer 612s; and FIG. 13B illustrates the vicinity of a regrowth layer 612d. The other elements are the same as in the sixth embodiment.

The same effects as in the sixth embodiment can be obtained in the seventh embodiment. Also, as in the third embodiment, since the back barrier layer 303 has a barrier effect by reverse piezoelectric charge, a superior pinch-off characteristic can be obtained. Furthermore, since the back barrier layer 303 is formed at a position deeper than the lower surface of the donor-containing region 231, and contacts the trap shield region 632, the movement path of electrons between the back barrier layer 303 and the donor-containing region 231 is cut off by the trap shield region 632. Therefore, decline of the pinch-off characteristic and increase in leakage current are inhibited, and hence, further higher output power and efficiency can be realized.

Figure 14:
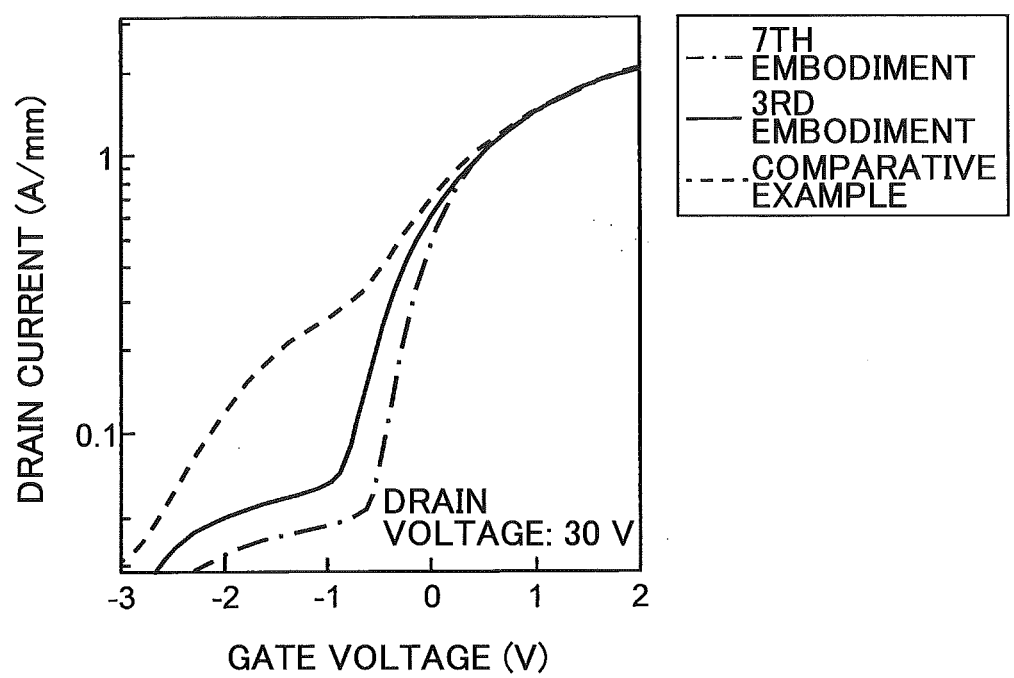
FIG. 14 is a diagram illustrating respective on-resistance characteristics and pinch-off characteristics of the seventh embodiment, the third embodiment, and the comparative example.

Respective on-resistance characteristics and pinch-off characteristics of the seventh embodiment, the third embodiment, and a comparative example are illustrated in FIG. 14. The voltage Vds between the drain and the source is 30 V. In the comparative example, the entire regrowth layer is constituted with a donor-containing region. As illustrated in FIG. 14, compared not only with the comparative example, but also with the third embodiment, the on-resistance is lower and the pinch-off characteristic is superior in the seventh embodiment. Therefore, the seventh embodiment is suitable for obtaining a higher output power and a higher efficiency.

In a method of manufacturing a semiconductor device according to the seventh embodiment, a back barrier layer 303 is formed, for example, between a process of forming a buffer layer 202, and a process of forming a channel layer 204. The back barrier layer 303 can be formed by a crystal growth method such as MOVPE. The other processes are the same as in the method for manufacturing the semiconductor device according to the sixth embodiment.

Figure 15:
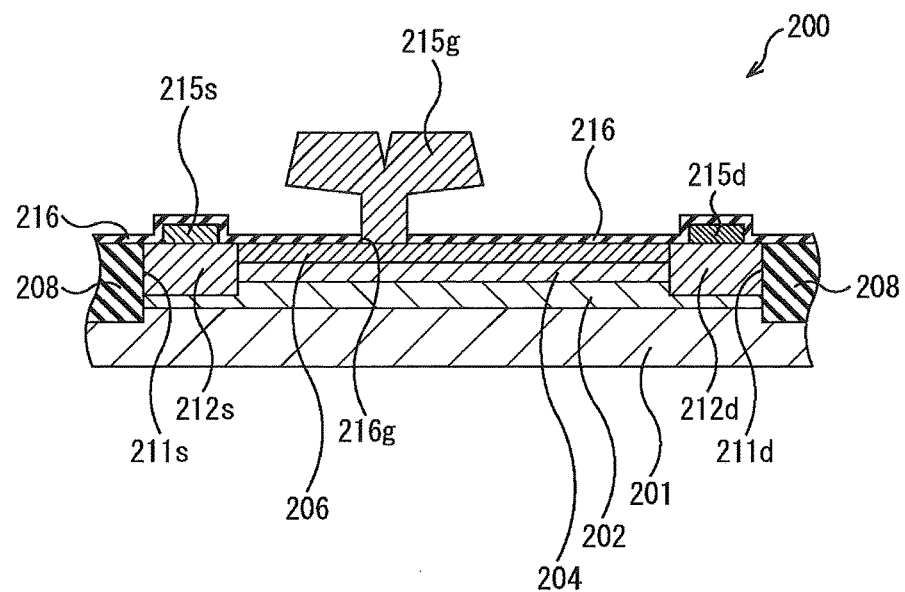
FIG. 15 is a cross-sectional view illustrating a modified example of the second embodiment.

In the case where the carrier supply layer is a nitride semiconductor layer that does not include In(s), such as an AlGaN layer, the intermediate layer 205 does not need to be included as illustrated in FIG. 15. Although a modified example of the second embodiment is illustrated in FIG. 15, the intermediate layer 205 does not need to be included also in the third to seventh embodiments.

Figure 16:
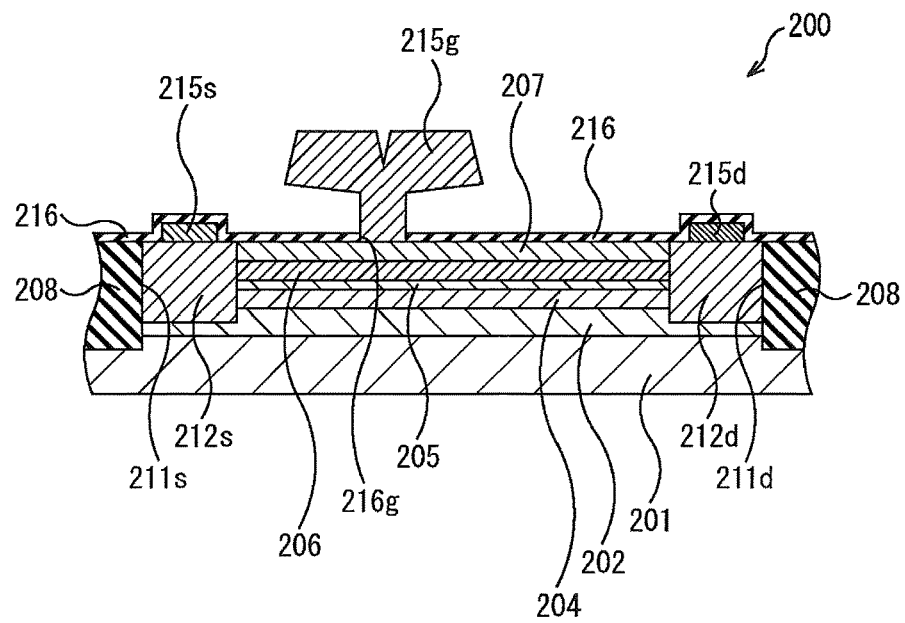
FIG. 16 is a cross-sectional view illustrating another modified example of the second embodiment.

As illustrated in FIG. 16, a cap layer 207 may be included over the carrier supply layer 206. The cap layer 207 is, for example, an n-type GaN layer (n-GaN layer) having the thickness of 2 nm to 10 nm. Although a modified example of the second embodiment is illustrated in FIG. 16, the cap layer 207 may be included also in the third to seventh embodiments.

Eighth Embodiment

Figure 17:
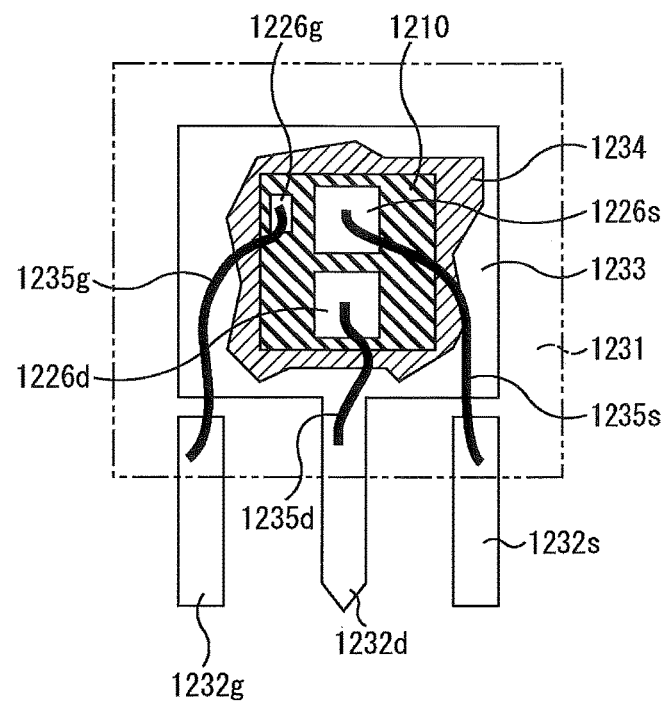
FIG. 17 is a diagram illustrating a discrete package according to an eighth embodiment.

Next, an eighth embodiment will be described. The eighth embodiment relates to a discrete package of a HEMT. FIG. 17 is a diagram illustrating the discrete package according to the eighth embodiment.

In the eighth embodiment, as illustrated in FIG. 17, a back surface of a HEMT chip 1210 of a HEMT according to any one of the second to seventh embodiments is fixed on a land (a die pad) 1233 by using a die attaching agent 1234 such as solder. A wire 1235d such as an Al wire is bonded to a drain pad 1226d that is connected with a drain electrode 105d, and the other end of the wire 1235d is bonded to a drain lead 1232d that is integrated with the land 1233. A wire 1235s such as an Al wire is bonded to a source pad 1226s that is connected with a source electrode 215s, and the other end of the wire 1235s is bonded to a source lead 1232s that is separated from the land 1233. A wire 1235g such as an Al wire is bonded to a gate pad 1226g that is connected with the gate electrode 215g, and the other end of the wire 1235g is bonded to a gate lead 1232g that is separated from the land 1233. The land 1233, the HEMT chip 1210, and the like are packaged in a molding resin 1231 from which a portion of the gate lead 1232g, a portion of the drain lead 1232d, and a portion of the source lead 1232s project outwards.

Such a discrete package may be manufactured, for example, as follows. First, the HEMT chip 1210 is bonded to the land 1233 of a lead frame, by using a die attaching agent 1234 such as solder. Next, by bonding using the wires 1235g, 1235d, and 1235s, the gate pad 1226g is connected to the gate lead 1232g of the lead frame, the drain pad 1226d is connected to the drain lead 1232d of the lead frame, and the source pad 1226s is connected to the source lead 1232s of the lead frame. Then, a transfer molding process is executed to seal these elements by using the molding resin 1231. Subsequently, the lead frame is cut off.

Ninth Embodiment

Figure 18:
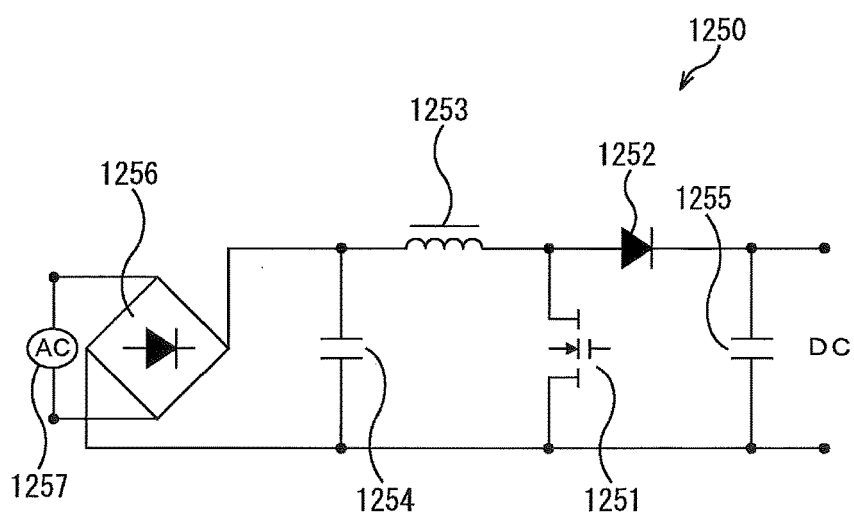
FIG. 18 is a connection diagram illustrating a PFC circuit according to a ninth embodiment.

Next, a ninth embodiment will be described. The ninth embodiment relates to a PFC (power factor correction) circuit that includes a HEMT. FIG. 18 is a connection diagram illustrating the PFC circuit according to the ninth embodiment.

A PFC circuit 1250 has a switching element (a transistor) 1251, a diode 1252, a choke coil 1253, capacitors 1254 and 1255, a diode bridge 1256, and an AC power source (AC) 1257. The drain electrode of the switching element 1251, the anode terminal of the diode 1252, and one terminal of the choke coil 1253 are connected with each other. The source electrode of the switching element 1251, one terminal of the capacitor 1254, and one terminal of the capacitor 1255 are connected with each other. The other terminal of the capacitor 1254 and the other terminal of the choke coil 1253 are connected with each other. The other terminal of the capacitor 1255 and the cathode terminal of the diode 1252 are connected with each other. Also, a gate driver is connected to the gate electrode of the switching element 1251. The AC 1257 is connected between both terminals of the capacitor 1254 via the diode bridge 1256. A DC power source (DC) is connected between both terminals of the capacitor 1255. In this embodiment, a HEMT according to any one of the second to seventh embodiments is used as the switching element 1251.

When manufacturing the PFC circuit 1250, the switching element 1251 is connected to the diode 1252, the choke coil 1253, and the like by using, for example, solder.

Tenth Embodiment

Figure 19:
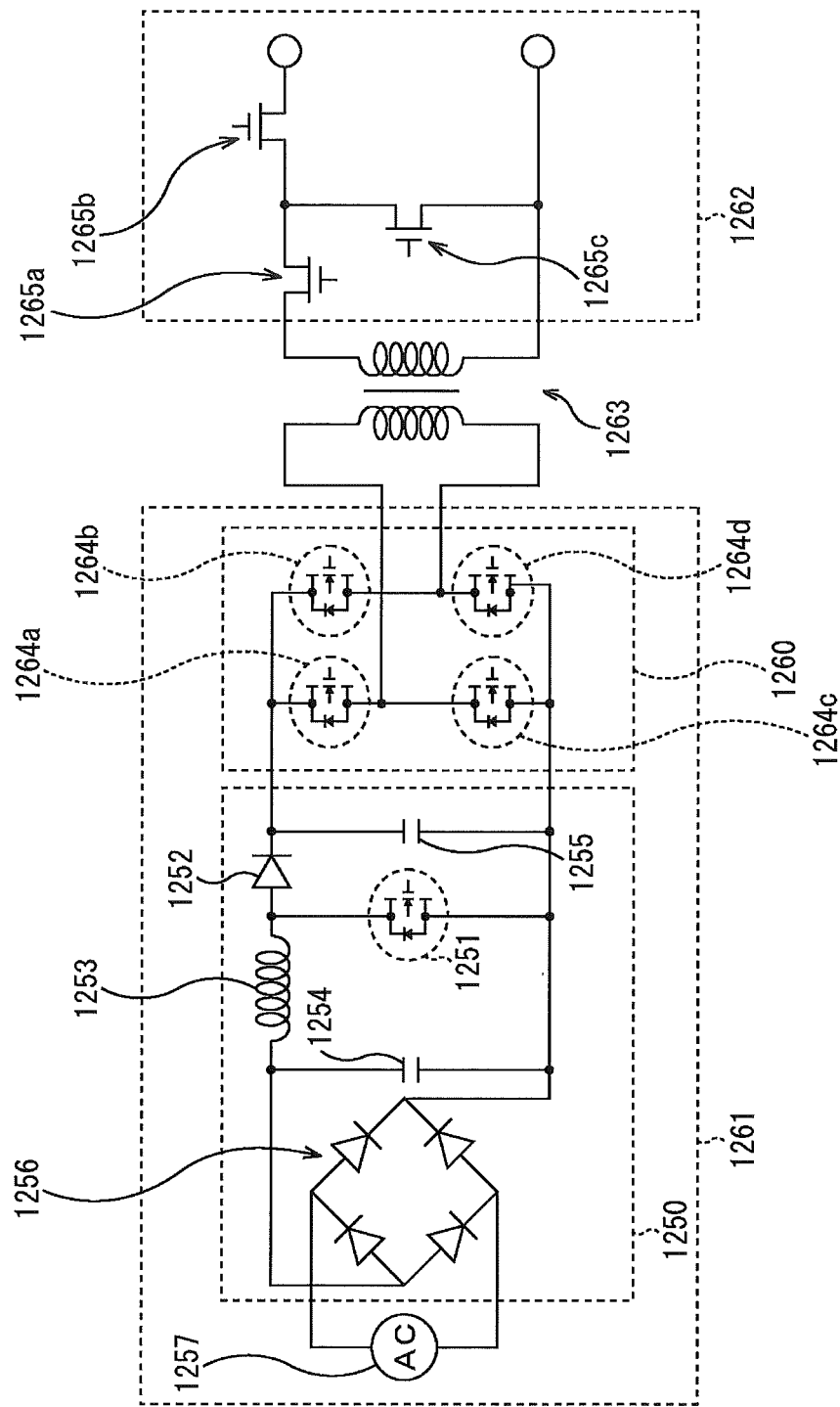
FIG. 19 is a connection diagram illustrating a power supply apparatus according to a tenth embodiment.

Next, a tenth embodiment will be described. The tenth embodiment relates to a power supply apparatus that includes HEMTs. FIG. 19 is a connection diagram illustrating the power supply apparatus according to the tenth embodiment.

The power supply apparatus includes a high-voltage primary-side circuit 1261, a low-voltage secondary side circuit 1262, and a transformer 1263 disposed between the primary-side circuit 1261 and the secondary-side circuit 1262.

The primary-side circuit 1261 includes a PFC circuit 1250 according to the ninth embodiment, and an inverter circuit that is connected between both terminals of the capacitor 1255 of the PFC circuit 1250, for example, a full-bridge inverter circuit 1260. The full-bridge inverter circuit 1260 includes multiple (here, four) switching elements 1264a, 1264b, 1264c, and 1264d.

The secondary-side circuit 1262 includes multiple (here, three) switching elements 1265a, 1265b, and 1265c.

In this embodiment, in the PFC circuit 1250 and the full-bridge inverter circuit 1260 that are included in the primary-side circuit 1261, HEMTs according to any one of the second to seventh embodiments are used as the switching element 1251 of the PFC circuit 1250, and as the switching elements 1264a, 1264b, 1264c, and 1264d of the full-bridge inverter circuit 1260. On the other hand, ordinary silicon-based MISFETs (metal-insulator-semiconductor field-effect transistors) are used as the switching elements 1265a, 1265b, and 1265c of the secondary-side circuit 1262.

Eleventh Embodiment

Figure 20:
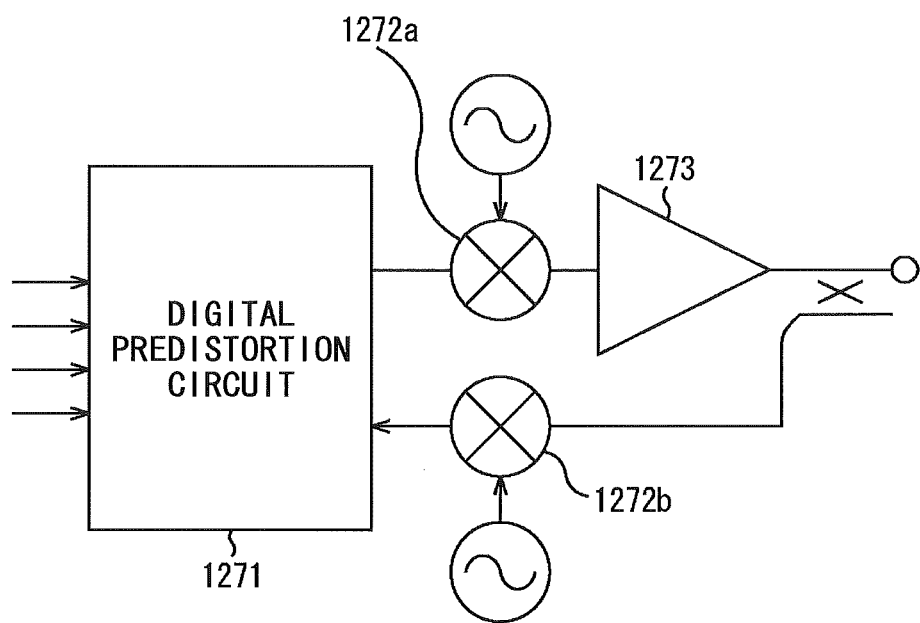
FIG. 20 is a connection diagram illustrating an amplifier according to an eleventh embodiment.

Next, an eleventh embodiment will be described. The eleventh embodiment relates to an amplifier that includes a HEMT. FIG. 20 is a connection diagram illustrating the amplifier according to the eleventh embodiment.

The amplifier includes a digital predistortion circuit 1271, mixers 1272a and 1272b, and a power amplifier 1273.

The digital predistortion circuit 1271 compensates input signals for non-linear distortion. The mixer 1272a mixes the input signal having the non-linear distortion compensated, with an AC signal. The power amplifier 1273 includes a HEMT according to any one of the second to seventh embodiments, and amplifies the input signal mixed with the AC signal. Note that in this embodiment, for example, by turning on/off a switch, it is possible to mix an output-side signal with an AC signal by using the other mixer 1272b, and to transmit the mixed signal to the digital predistortion circuit 1271. The amplifier may be used as a high-frequency amplifier or a high-output amplifier.

Note that the composition of a compound semiconductor layer used in the stacked layer structure including from the buffer layer to the cap layer is not limited in particular; for example, nitride semiconductors such as GaN, AlN, and InN can be used. Also, a mixed crystal of these may be used. The channel layer may also contain a very small quantity of In or Al. In the case where the channel layer contains In, the back barrier layer contains In at a higher concentration than the channel layer.

In any one of the embodiments, a silicon carbide (SiC) substrate, a sapphire substrate, a silicon substrate, a GaN substrate, or a GaAs substrate may be used as the substrate. The substrate may be conductive, semi-insulating, or insulating.

The structures of the gate electrode, the source electrode, and the drain electrode are not limited to those described in the above embodiments. For example, these may consist of a single layer. Also, the method of forming these electrodes is not limited to a lift-off method. Furthermore, a heat treatment may be omitted after having formed the source electrode and the drain electrode as long as the ohmic characteristic is obtained. Other than Ni and Au, Pd and/or Pt may be included in the gate electrode. Also, the number of the gate electrodes, the source electrodes, and the drain electrodes is not limited to the number described in the above embodiments. All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device comprising:
 a buffer layer;
 a channel layer over the buffer layer;
 a carrier supply layer over the channel layer;
 a first recess and a second recess that are formed in the channel layer and the carrier supply layer, and that reach the buffer layer;
 a first nitride semiconductor layer in the first recess;
 a second nitride semiconductor layer in the second recess;
 a source electrode over the first nitride semiconductor layer;
 a drain electrode over the second nitride semiconductor layer; and
 a gate electrode over the carrier supply layer between the first recess and the second recess,
 wherein each of the first nitride semiconductor layer and the second nitride semiconductor layer includes
 a first region containing donors, and
 a second region under the first region,
 wherein an interface between the first region and the second region is positioned deeper than two-dimensional electron gas on a surface side of the channel layer, and
 wherein energy at a bottom of a conduction band of the second region is higher than energy at a bottom of a conduction band of the first region.

2. The semiconductor device as claimed in claim 1, further comprising:
 a back barrier layer between the buffer layer and the channel layer.

3. The semiconductor device as claimed in claim 2, wherein the back barrier layer includes In at a higher concentration than the channel layer.

4. The semiconductor device as claimed in claim 2, wherein the back barrier layer contacts the second region.

5. The semiconductor device as claimed in claim 1, wherein the second region is of i-type.

6. The semiconductor device as claimed in claim 5, wherein the first region includes an n-type GaN, and the second region includes an i-type GaN.

7. The semiconductor device as claimed in claim 1, wherein each of the first nitride semiconductor layer and the second nitride semiconductor layer includes a third region containing donors under the second region.

8. The semiconductor device as claimed in claim 7, wherein the third region includes an n-type GaN.

9. The semiconductor device as claimed in claim 1, wherein a band gap of the second region is greater than a band gap of the buffer layer.

10. The semiconductor device as claimed in claim 9, wherein the first region includes an n-type GaN, and the second region includes AlGaN.

11. The semiconductor device as claimed in claim 1, wherein the carrier supply layer includes In and Al.

12. The semiconductor device as claimed in claim 1, wherein the first region includes Si as donors at a concentration of $1 \times 10^{19}$ cm$^{-3}$ or greater.

13. A method of manufacturing a semiconductor device, the method comprising:
 a process of forming a channel layer over a buffer layer;
 a process of forming a carrier supply layer over the channel layer;
 a process of forming a first recess and a second recess that reach the buffer layer, in the channel layer and the carrier supply layer;
 a process of forming a first nitride semiconductor layer in the first recess, and forming a second nitride semiconductor layer in the second recess;
 a process of forming a source electrode over the first nitride semiconductor layer, and forming a drain electrode over the second nitride semiconductor layer;
 a process of forming a gate electrode over the carrier supply layer between the first recess and the second recess,
 wherein the process of forming the first nitride semiconductor layer and the second nitride semiconductor layer includes
 a process of forming a second region, and
 a process of forming a first region containing donors over the second region,
 wherein an interface between the first region and the second region is positioned deeper than two-dimensional electron gas on a surface side of the channel layer, and
 wherein energy at a bottom of a conduction band of the second region is higher than energy at a bottom of a conduction band of the first region.

* * * * *